US009974171B2

(12) United States Patent
Xu et al.

(10) Patent No.: US 9,974,171 B2
(45) Date of Patent: May 15, 2018

(54) CIRCUIT BOARD AND METHOD FOR FABRICATING THE SAME

(71) Applicant: BYD COMPANY LIMITED, Shenzhen, Guangdong (CN)

(72) Inventors: Qiang Xu, Guangdong (CN); Xinping Lin, Guangdong (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days. days.

(21) Appl. No.: 14/943,747

(22) Filed: Nov. 17, 2015

(65) Prior Publication Data

US 2016/0073497 A1 Mar. 10, 2016

Related U.S. Application Data

(63) Continuation of application No. PCT/CN2014/078066, filed on May 21, 2014.

(30) Foreign Application Priority Data

May 23, 2013 (CN) .......................... 2013 1 0196540

(51) Int. Cl.
| | | |
|---|---|---|
| H05K 1/05 | (2006.01) | |
| H05K 3/18 | (2006.01) | |
| C25D 11/24 | (2006.01) | |
| H05K 3/44 | (2006.01) | |
| C23C 18/18 | (2006.01) | |
| C23C 18/16 | (2006.01) | |
| C25D 11/08 | (2006.01) | |
| C25D 11/16 | (2006.01) | |
| C23C 18/40 | (2006.01) | |
| C25D 11/10 | (2006.01) | |

(52) U.S. Cl.
CPC ......... *H05K 1/053* (2013.01); *C23C 18/1608* (2013.01); *C23C 18/1612* (2013.01); *C23C 18/1868* (2013.01); *C23C 18/1879* (2013.01); *C25D 11/246* (2013.01); *H05K 3/185* (2013.01); *H05K 3/44* (2013.01); *C23C 18/40* (2013.01); *C25D 11/08* (2013.01); *C25D 11/10* (2013.01); *C25D 11/16* (2013.01); *H05K 2201/0116* (2013.01); *H05K 2203/0315* (2013.01); *H05K 2203/107* (2013.01); *H05K 2203/1147* (2013.01)

(58) Field of Classification Search
CPC .. H05K 1/02; H05K 1/05; H05K 1/09; H05K 1/11; H05K 3/00; H05K 1/16; H01L 21/02; H01L 21/58; H01L 23/06; H01L 23/48; H01L 23/52; H01L 21/20; H01L 21/31; H01L 21/67; H01L 23/02; H01L 23/12; H01L 23/15; H01L 23/34

USPC ................ 174/257, 258, 266, 256; 361/783; 257/664, 758; 148/244, 264, 272, 275; 428/195.1, 209, 447, 472, 544, 551, 607; 438/158, 688; 252/582
See application file for complete search history.

(56) References Cited

U.S. PATENT DOCUMENTS

| | | | | |
|---|---|---|---|---|
| 3,635,761 A | * | 1/1972 | Haag ....................... | C23C 18/52 106/1.22 |
| 3,763,004 A | * | 10/1973 | Wainer ..................... | C25D 5/02 204/486 |
| 3,765,994 A | * | 10/1973 | Quaintance .............. | B41M 1/28 219/543 |
| 3,785,854 A | * | 1/1974 | Baldi ....................... | C23C 10/60 148/264 |
| 3,805,023 A | * | 4/1974 | Wainer ..................... | C25D 5/02 106/1.13 |
| 3,953,625 A | * | 4/1976 | Quaintance .............. | B41M 1/28 427/258 |
| 4,374,754 A | * | 2/1983 | Arai ........................ | B01J 31/124 126/19 R |
| 4,433,004 A | * | 2/1984 | Yonezawa .......... | H01L 21/02142 148/240 |
| 4,504,325 A | * | 3/1985 | Moji ...................... | C25D 11/246 148/264 |
| 4,504,717 A | * | 3/1985 | Arai ........................ | B01J 31/124 219/685 |
| 4,756,771 A | * | 7/1988 | Brodalla .............. | C25D 11/246 148/244 |
| 4,820,362 A | * | 4/1989 | Baldi .................... | B65D 43/022 149/109.6 |
| 4,829,658 A | * | 5/1989 | Pichler ................. | G11B 5/3103 29/603.09 |
| 4,856,181 A | * | 8/1989 | Pichler ................. | G11B 5/3103 216/22 |
| 4,883,704 A | * | 11/1989 | Sato ...................... | C04B 35/581 257/E23.009 |
| 5,087,509 A | * | 2/1992 | Kuromitsu .............. | H01L 23/15 156/89.15 |
| 5,096,768 A | * | 3/1992 | Kuromitsu .............. | H01L 23/15 257/E23.009 |

(Continued)

FOREIGN PATENT DOCUMENTS

| | | |
|---|---|---|
| CN | 101045996 A | 10/2007 |
| CN | 101076224 A | 11/2007 |

(Continued)

OTHER PUBLICATIONS

PCT International Search Report and Written Opinion dated Aug. 26, 2014, issued in corresponding International Application No. PCT/CN2014/078066 (15 pages).

(Continued)

*Primary Examiner* — Xiaoliang Chen

(57) ABSTRACT

Embodiments of the present disclosure are directed to a circuit board. The circuit board comprises: an aluminum-based substrate; an alumina layer formed on at least one surface of the aluminum-based substrate; and a circuit layer formed on the alumina layer. The alumina layer comprises alumina and an element selected from a group consisting of chromium, nickel, a rare earth metal, and a combination thereof.

8 Claims, No Drawings

(56) References Cited

U.S. PATENT DOCUMENTS

| | | | | |
|---|---|---|---|---|
| 5,126,921 A * | 6/1992 | Fujishima | H01G 4/10 | 29/25.03 |
| 5,426,849 A * | 6/1995 | Kimbara | H01L 21/4857 | 156/182 |
| 5,498,278 A * | 3/1996 | Edlund | B01D 53/22 | 55/524 |
| 5,527,562 A * | 6/1996 | Balaba | G02B 1/105 | 427/162 |
| 5,624,640 A * | 4/1997 | Potthast | G01N 27/12 | 204/432 |
| 5,645,626 A * | 7/1997 | Edlund | B01D 53/22 | 95/56 |
| 5,688,606 A * | 11/1997 | Mahulikar | H01L 23/142 | 205/105 |
| 5,709,927 A * | 1/1998 | Miyase | H01C 1/146 | 257/E27.115 |
| 5,879,969 A * | 3/1999 | Yamazaki | H01L 21/76897 | 257/E21.413 |
| 5,912,066 A * | 6/1999 | Takahashi | H01L 23/15 | 257/E23.009 |
| 6,037,089 A | 3/2000 | Yahagi et al. | | |
| 6,080,491 A * | 6/2000 | Takaki | G03G 5/102 | 148/272 |
| 6,288,414 B1 * | 9/2001 | Ahn | G02F 1/13458 | 257/503 |
| 6,316,752 B1 * | 11/2001 | Smetana | F42B 3/124 | 219/541 |
| 6,329,065 B1 * | 12/2001 | Ishida | H01L 23/15 | 174/256 |
| 6,410,197 B1 * | 6/2002 | Bellino | G03G 5/0546 | 399/116 |
| 6,528,123 B1 * | 3/2003 | Cadden | C04B 37/026 | 427/250 |
| 6,600,158 B1 * | 7/2003 | Okada | G01T 1/2002 | 250/370.11 |
| 2002/0021544 A1 * | 2/2002 | Cho | H01L 27/11502 | 361/200 |
| 2002/0132730 A1 * | 9/2002 | Hwang | A47L 19/04 | 502/212 |
| 2003/0168750 A1 * | 9/2003 | Basceri | H01L 28/75 | 257/532 |
| 2003/0170536 A1 * | 9/2003 | Aihara | H01M 2/166 | 429/162 |
| 2003/0213987 A1 * | 11/2003 | Basceri | H01L 21/3141 | 257/296 |
| 2004/0043269 A1 * | 3/2004 | Taniguchi | H01M 8/1226 | 429/482 |
| 2004/0126608 A1 * | 7/2004 | Gotoh | C23C 14/185 | 428/544 |
| 2004/0246690 A1 * | 12/2004 | Nakamura | H01L 23/49816 | 361/763 |
| 2005/0056939 A1 * | 3/2005 | Ooi | H01G 4/10 | 257/761 |
| 2005/0158628 A1 * | 7/2005 | Watanabe | H01G 11/20 | 429/245 |
| 2005/0208718 A1 * | 9/2005 | Lim | H01L 28/75 | 438/240 |
| 2006/0183270 A1 * | 8/2006 | Humpston | B23K 3/0623 | 438/106 |
| 2006/0209920 A1 * | 9/2006 | Kamiyama | G01K 7/42 | 374/29 |
| 2007/0054132 A1 * | 3/2007 | LaBarge | B32B 18/00 | 428/432 |
| 2007/0134931 A1 * | 6/2007 | Ahn | H01L 21/28194 | 438/758 |
| 2007/0177092 A1 * | 8/2007 | Hosoya | G02F 1/1345 | 349/149 |
| 2008/0001143 A1 * | 1/2008 | Nomura | H01L 27/1021 | 257/40 |
| 2008/0118858 A1 * | 5/2008 | Yuuya | G03G 5/08 | 430/133 |
| 2008/0127481 A1 * | 6/2008 | Lee | G11B 5/127 | 29/603.15 |
| 2008/0144291 A1 * | 6/2008 | Hu | H05K 1/053 | 361/720 |
| 2009/0032914 A1 * | 2/2009 | Kwon | H01L 21/4857 | 257/664 |
| 2009/0180788 A1 * | 7/2009 | Tamoto | G03G 5/043 | 399/48 |
| 2010/0067224 A1 * | 3/2010 | Wu | F21K 9/00 | 362/235 |
| 2010/0152032 A1 * | 6/2010 | Galligan | B01D 53/8675 | 502/201 |
| 2010/0219079 A1 * | 9/2010 | Routkevitch | B01D 53/228 | 205/175 |
| 2010/0319968 A1 * | 12/2010 | Yao | C25D 11/04 | 174/257 |
| 2011/0000708 A1 * | 1/2011 | Nakai | C25D 1/04 | 174/266 |
| 2011/0012252 A1 | 1/2011 | Gao et al. | | |
| 2011/0037164 A1 * | 2/2011 | Kwon | H01L 21/4857 | 257/709 |
| 2011/0133854 A1 | 6/2011 | Moon et al. | | |
| 2012/0097289 A1 * | 4/2012 | Chun | F16L 9/02 | 138/177 |
| 2012/0097581 A1 * | 4/2012 | Chun | F16L 9/02 | 208/48 R |
| 2012/0155811 A1 * | 6/2012 | Chiang | G02B 6/4201 | 385/89 |
| 2012/0211400 A1 * | 8/2012 | Chun | F16L 9/02 | 208/47 |
| 2012/0313245 A1 * | 12/2012 | Horiuchi | H01L 23/49827 | 257/758 |
| 2012/0327626 A1 * | 12/2012 | Horiuchi | H01L 23/49822 | 361/783 |
| 2013/0119376 A1 * | 5/2013 | Sasagawa | H01L 29/66742 | 257/43 |
| 2013/0157422 A1 * | 6/2013 | Yamazaki | H01L 29/66742 | 438/158 |
| 2013/0161610 A1 * | 6/2013 | Yamazaki | H01L 29/7869 | 257/43 |

FOREIGN PATENT DOCUMENTS

| | | | | |
|---|---|---|---|---|
| CN | 101275266 A | 10/2008 | | |
| CN | 101958307 A | 1/2011 | | |
| CN | 102159024 A | 8/2011 | | |
| CN | 102650068 A | 8/2012 | | |
| CN | 102762037 A | 10/2012 | | |
| CN | 103094126 A | 5/2013 | | |
| JP | 2012-212788 A | 11/2012 | | |
| KR | 10-2007-0039006 A | 4/2007 | | |
| WO | WO 2006059872 A1 * | 6/2006 | | C09D 5/103 |
| WO | 2012/155811 A1 | 11/2012 | | |
| WO | WO 2014/187330 A1 | 11/2014 | | |

OTHER PUBLICATIONS

Takahashi, Hideaki et al., "Micro- and Nano-Technologies Based on Anodizing of Aluminum—Combination of Laser Irradiation with Electrochemical Process," Electrochemistry, 2009, vol. 77, No. 1, p. 30-43.

\* cited by examiner

CIRCUIT BOARD AND METHOD FOR FABRICATING THE SAME

CROSS-REFERENCE TO RELATED APPLICATION

This application is a continuation of International Application No. PCT/CN2014/078066, filed May 21, 2014, which claims priority to and benefits of Chinese Patent Application Serial No. 201310196540.7, filed with the State Intellectual Property Office of P. R. China on May 23, 2013. The above referenced applications are incorporated herein by reference in their entirety.

FIELD

The present disclosure relates to a circuit board and a method for fabricating the same.

BACKGROUND

An aluminum-based circuit board is widely applied in a variety of electronic and electric devices. Currently, the aluminum-based circuit board is usually fabricated by following steps of: forming an organic layer on a surface of an aluminum substrate or an aluminum alloy substrate; combining a copper foil with the organic layer via hot pressing; performing photolithography and etching to form a circuit layer. In this method, the circuit layer and the aluminum-based substrate are connected via the organic layer. However, a thermal conductivity of the organic layer is usually lower than 4 W/(m·K), which reduces a thermal dissipation efficiency of the circuit board.

Therefore, there is a need for an aluminum-based circuit board with a good thermal dissipation.

SUMMARY

Embodiments of the present disclosure seek to solve at least one of the problems existing in aluminum-based circuit boards.

There is a method for fabricating an aluminum-based circuit board, comprising: performing an anodic oxidation for an aluminum-based substrate to form an alumina layer; introducing a compound containing Pd into the alumina layer; chemically plating the aluminum-based substrate to form a metal layer on the alumina layer; and etching the metal layer to form a circuit layer. However, an adhesive force of the circuit layer of the circuit board fabricated by this method is too low to meet requirements of use. Besides, this method is complicated in process.

Applicants have found that if the aluminum-based substrate treated by the anodic oxidation is sealed to form an alumina layer including at least one element selected from chromium, nickel, and a rare earth metal, not only may a corrosion resistance and a weather resistance of the alumina layer be improved, but also a hardness and an abrasion resistance of the alumina layer may be increased. Moreover, since both the alumina layer and the element(s) filled in the alumina layer can absorb light from a laser, an absorption of the alumina layer for an energy beam may be substantially improved, such that the alumina layer irradiated by the energy beam may have a high chemical plating activity, which makes it possible to selectively form the circuit layer on the alumina layer by chemical plating. The adhesive force of the circuit layer of the circuit board fabricated by this method is substantially increased.

According to a first aspect of the present disclosure, a circuit board is provided. The circuit board comprises: an aluminum-based substrate; an alumina layer formed on at least one surface of the aluminum-based substrate; and a circuit layer formed on the alumina layer. The alumina layer comprises alumina and an element selected from a group consisting of chromium, nickel, a rare earth metal, and a combination thereof.

With the circuit board according to embodiments of the present disclosure, the circuit layer and the aluminum-based substrate are connected via the alumina layer. Since a thermal conductivity of the alumina layer which is about 20 W/(m·K) is higher than that of an organic layer, a heat produced by the circuit layer may be transferred to the aluminum-based substrate in time for dissipation. Therefore, the circuit board according to embodiments of the present disclosure has a good thermal dissipation capability. Besides, the adhesive force of the circuit layer of the circuit board is increased to ISO levels 1-0.

According to a second aspect of the present disclosure, a method for fabricating a circuit board is provided. The method comprises: providing an aluminum-based substrate; performing an anodic oxidation for the aluminum-based substrate to form an alumina layer on at least one surface of the aluminum-based substrate; contacting the aluminum-based substrate with a solution containing a sealing agent to perform a sealing for the alumina layer so as to fill at least one element in the alumina layer, wherein the element is selected from a group consisting of chromium, nickel, a rare earth metal, and a combination thereof; irradiating a part of the alumina layer by an energy beam to activate the part of the alumina layer; and performing a chemical plating on the aluminum-based substrate to form a circuit layer on the part of the alumina layer so as to form the circuit board.

With the method for fabricating the circuit board according to embodiments of the present disclosure, the alumina layer is sealed by a proper sealing agent, and activated by the energy beam to obtain the chemical plating activity. In this way, not only does the circuit board have a good thermal dissipation capability, but also the circuit layer has a high adhesive force and a circuit may have a high precision. In addition, the method according to embodiments of the present disclosure is relatively simple to implement on a large scale.

Additional aspects and advantages of embodiments of present disclosure will be given in part in the following descriptions, become apparent in part from the following descriptions, or be learned from the practice of the embodiments of the present disclosure.

DETAILED DESCRIPTION

Reference will be made in detail to embodiments of the present disclosure. The embodiments described herein with reference to examples are explanatory, illustrative, and used to generally understand the present disclosure. The embodiments shall not be construed to limit the present disclosure.

According to embodiments of the present disclosure, a circuit board is provided. The circuit board comprises: an aluminum-based substrate, an alumina layer, and a circuit layer. The alumina layer is formed on at least one surface of the aluminum-based substrate, and the circuit layer is formed on the alumina layer. The alumina layer comprises alumina and an element selected from a group consisting of chromium, nickel, a rare earth metal, and a combination thereof.

In one embodiment, the rare earth metal may be selected from a group consisting of lanthanum, cerium, praseodymium, neodymium, promethium, samarium, europium, gadolinium, terbium, dysprosium, holmium, erbium, thulium, ytterbium, lutetium, scandium, yttrium, and a combination thereof. In another embodiment, the rare earth metal may be selected from a group consisting of lanthanum, cerium, yttrium, and a combination thereof.

An existing form of the element in the alumina layer is not limited herein. For example, the element(s) may exist in the alumina layer in a form of a compound, a simple substance, or a combination thereof.

A content of the element(s) in the alumina layer is adjusted in such a way that the alumina layer may have a chemical plating activity by an irradiation with an energy beam. In some embodiments, the content of the element(s) in the alumina layer is 0.001 wt % or above, such that the alumina layer may have a chemical plating activity by the irradiation with the energy beam. In one embodiment, the content of the element(s) in the alumina layer is 0.005 wt % or above, or 0.01 wt % or above, for example, such that not only may the alumina layer have a chemical plating activity by the irradiation with the energy beam, but also a higher chemical plating rate may be achieved. In some embodiments, the content of the element(s) in the alumina layer ranges from 0.001 wt % to 20 wt %. In some embodiments, the content of the element(s) in the alumina layer ranges from 0.005 wt % to 10 wt %, more preferably from 0.01 wt % to 1 wt %, further preferably from 0.05 wt % to 0.5 wt %, most preferably from 0.08 wt % to 0.25 wt %. The content of the element(s) in the alumina layer may be measured by SEM-EDX (scanning electron microscope-energy dispersive X-ray detector), in which, for example, the content of the element(s) may be an average of 20 counting points.

The alumina layer may be formed by various processes. In one embodiment, the alumina layer is formed by performing an anodic oxidation for the aluminum-based substrate. Then, the alumina layer may be filled with the element by various processes. In one embodiment, the alumina layer is immersed in a solution of a compound containing the element, and then is dried to form the alumina layer filled with the element. Alternatively or additionally, the alumina layer may be filled with the element by CVD (chemical vapor deposition). In another embodiment, the alumina layer may be formed by performing an anodic oxidation and a sealing for the aluminum-based substrate. In this way, not only may a corrosion resistance and/or a weather resistance of the alumina layer be improved, but also a hardness and/or an abrasion resistance of the alumina layer may be increased. Besides, the alumina layer may have a chemical plating activity by the irradiation with the energy beam.

In one embodiment, a sealing agent used in the sealing may be a water soluble substance selected from a group consisting of a dichromate, a nickel salt, a rare earth metal salt, and a combination thereof. For example, the sealing agent may be selected from a group consisting of an alkali metal dichromate (such as sodium dichromate, potassium dichromate), nickel fluoride, nickel acetate, nickel sulfate, nickel chloride, nickel sulfamic acid, nickel bromide, nickel hydroxide ($Ni(OH)_2$), nickel carbonyl, a water soluble chloride of a rare earth metal, a water soluble sulfate of a rare earth metal, a fluoride of a rare earth metal, a bromide of a rare earth metal, and a combination thereof.

In one embodiment, the sealing agent is selected from a group consisting of a dichromate, a nickel salt, and a combination thereof. In this case, the sealed alumina layer has a higher absorption for an energy beam, especially for an energy beam with a low energy. In another embodiment, the sealing agent is selected from a group consisting of potassium dichromate, sodium dichromate, nickel fluoride, nickel acetate, nickel sulfate, and a combination thereof.

In some embodiments, a thickness of the alumina layer may range from 10 μm to 300 μm. In one embodiment, the thickness of the alumina layer ranges from 50 μm to 100 μm, such that not only does the circuit board have a high withstand voltage, but also the thickness of the circuit board is not too large.

A thickness of the circuit layer is not limited herein, which may depend on the practical application, for example, the thickness of the circuit layer may range from 10 μm to 100 μm.

With the circuit board according to embodiments of the present disclosure, the adhesive force between the circuit layer and the alumina layer is of levels 1-0, e.g., of level 0. The adhesive force may be measured using a BYK process disclosed in ISO 2409.

According to embodiments of the present disclosure, a method for fabricating a circuit board is provided. The method comprises the following steps.

At step S1, an aluminum-based substrate is provided. The aluminum-based substrate may be any type of substrate for a circuit board, such as an aluminum substrate or an aluminum alloy substrate. The aluminum-based substrate may be pretreated by rinsing or polishing to remove an oil stain and/or an oxide film on a surface of the aluminum-based substrate.

At step S2, an anodic oxidation is performed for the aluminum-based substrate to form an alumina layer on at least one surface of the aluminum-based substrate.

In one embodiment, the aluminum-based substrate is immersed into an electrolyte for the anodic oxidation. The electrolyte is not limited herein. For example, the electrolyte may be a solution containing any one of sulfuric acid, chromic acid, oxalic acid, and a combination thereof.

In some embodiments, the anodic oxidation may be performed at a voltage ranging from 10 V to 30 V and at a temperature ranging from 20° C. to 70° C. for a duration of time ranging from 30 min to 120 min.

At step S3, the aluminum-based substrate is contacted with a solution containing a sealing agent to perform a sealing for the alumina layer so as to fill an element in the alumina layer. The element is selected from a group consisting of chromium, nickel, a rare earth metal, and a combination thereof.

In one embodiment, the sealing agent may be selected from a group consisting of a dichromate, a nickel salt, a rare earth metal salt, and a combination thereof. The rare earth metal may be selected from a group consisting of lanthanum, cerium, praseodymium, neodymium, promethium, samarium, europium, gadolinium, terbium, dysprosium, holmium, erbium, thulium, ytterbium, lutecium, scandium, yttrium, and a combination thereof. In one embodiment, the rare earth metal may be selected from a group consisting of lanthanum, cerium, yttrium, and a combination thereof. By using one or more of these sealing agents to seal the alumina layer, not only may micro pores in the alumina layer be closed so as to increase a corrosion resistance, a weather resistance, a hardness, and/or an abrasion resistance of the alumina layer, but also the sealed alumina layer may have a higher absorption for an energy beam, especially for an energy beam with a low energy so as to obtain a chemical plating activity by the irradiation with the energy beam, thus further forming a circuit on the alumina layer.

In one embodiment, the sealing agent may be a water soluble substance selected from a group consisting of a dichromate, a nickel salt, a rare earth metal salt, and a combination thereof. For example, the sealing agent may be selected from a group consisting of an alkali metal dichromate (such as sodium dichromate, potassium dichromate), nickel fluoride, nickel acetate, nickel sulfate, nickel chloride, nickel sulfamic acid, nickel bromide, nickel hydroxide (Ni$(OH)_2$), nickel carbonyl, a water soluble chloride of a rare earth metal, a water soluble sulfate of a rare earth metal, a fluoride of a rare earth metal, a bromide of a rare earth metal, and a combination thereof.

In one embodiment, the sealing agent is selected from a group consisting of a dichromate, a nickel salt, and a combination thereof. In this case, the sealed alumina layer has a higher absorption for an energy beam, especially for an energy beam with a low energy, so as to achieve a high chemical plating rate during the chemical plating. In another embodiment, the sealing agent is selected from a group consisting of potassium dichromate, sodium dichromate, nickel fluoride, nickel acetate, nickel sulfate, and a combination thereof.

An amount of the sealing agent is adjusted in such a way that the alumina layer may have a chemical plating activity by an irradiation with an energy beam. In some embodiments, the amount of the sealing agent is adjusted so that a content of the element(s) in the alumina layer is 0.001 wt % or above, such that the alumina layer may have a chemical plating activity by the irradiation with the energy beam. In one embodiment, the amount of the sealing agent is adjusted so that the content of the element(s) in the alumina layer is 0.005 wt % or above, for example, 0.01 wt % or above, such that not only may the alumina layer have a chemical plating activity by the irradiation with the energy beam, but also a higher chemical plating rate may be achieved. In some embodiments, the amount of the sealing agent is adjusted so that the content of the element(s) in the alumina layer ranges from 0.001 wt % to 20 wt %. In one embodiment, the amount of the sealing agent is adjusted so that the content of the element(s) in the alumina layer ranges from 0.005 wt % to 10 wt %, e.g., from 0.01 wt % to 1 wt %, from 0.05 wt % to 0.5 wt %, or from 0.08 wt % to 0.25 wt %.

In one embodiment, the sealing agent is a nickel salt solution with a concentration ranging from 0.8 g/L to 1.6 g/L and a pH ranging from 5.5 to 6.5. The sealing may be performed at a temperature ranging from 25° C. to 80° C. (such as from 25° C. to 45° C.) for a duration time ranging from 10 min to 20 min.

In another embodiment, the sealing agent is a nickel salt and the solution of the sealing agent is a nickel salt solution with a concentration ranging from 1.4 g/L to 1.8 g/L. The nickel salt solution may also include an acetic acid solution with a concentration ranging from 0.1 wt % to 1 wt %, such that a pH of the nickel salt solution ranges from 5.5 to 6. The sealing may be performed at a temperature ranging from 85° C. to 95° C. for a duration of time ranging from 15 min to 20 min.

In another embodiment, the sealing agent is a rare earth metal salt and the solution of the sealing agent is a rare earth metal salt solution with a concentration ranging from 0.01 mol/L to 0.1 mol /L and a pH ranging from 4.5 to 6. The sealing may be performed at a temperature ranging from 95° C. to 98° C. for a duration of time ranging from 15 min to 35 min.

In another embodiment, the sealing agent is a dichromate and the solution of the sealing agent is a dichromate solution with a concentration ranging from 50 g/L to 70 g/L and a pH ranging from 6 to 7. The sealing may be performed at a temperature ranging from 90° C. to 95° C. for a duration of time ranging from 15 min to 35 min.

By using the methods according to above embodiments to seal the alumina layer, the sealed alumina layer has a higher absorption for an energy beam, especially for an energy beam with a low energy.

At step S4, a part of the alumina layer to be formed with a circuit is irradiated by an energy beam to activate the part of the alumina layer.

In one embodiment, the energy beam may be a laser, an electronic beam, or an ion beam. In one embodiment, the energy beam is an laser with a wavelength ranging from 200 nm to 3000 nm, a power ranging from 5 W to 3000 W, and a frequency ranging from 0.1 KHz to 200 KHz. In another embodiment, the energy beam is an electronic beam with a power density ranging from 10 W/cm$^2$ to 10$^{11}$ W/cm$^2$. In yet another embodiment, the energy beam is an ion beam with an energy ranging from 10 eV to 10$^6$ eV. In one embodiment, the energy beam is a laser, such as a laser with a wavelength ranging from 532 nm to 1064 nm and a power ranging from 20 W to 100 W, or a laser with a wavelength of 1064 nm and a power ranging from 20 W to 30 W.

If the laser is employed to irradiate the alumina layer, the laser may be generated by any type of laser devices, such as a YAG laser, a green light laser, and a fiber laser.

According to embodiments of the present disclosure, the alumina layer formed by anodic oxidation is further sealed by the sealing agent selected from the group consisting of a dichromate, a nickel salt, a rare earth metal salt, and a combination thereof, such that the absorption of the sealed alumina layer for an energy beam is improved, and thus the sealed alumina layer can be activated to have the chemical plating activity by irradiating at least a part of the alumina layer using an energy beam with a low energy. By using the energy beam with a low energy to irradiate the alumina layer, in one aspect a fabrication cost can be reduced, and in another aspect a fine pattern may be formed in the alumina layer and thus a high precision circuit may be formed accordingly.

At step S5, the chemical plating is performed for the aluminum-based substrate to form a circuit layer on the part of the alumina layer so as to form the circuit board.

As the part of the alumina layer irradiated by the energy beam has the chemical plating capability, while a remaining part of the alumina layer not irradiated does not have the chemical plating capability, the circuit can be formed on the part of the alumina layer irradiated by the energy beam. For example, after the irradiation, the aluminum-based substrate is immersed into a copper plating solution containing a cupric salt and a reducing agent and with a pH ranging from 12 to 13. Copper ions in the cupric salt may be reduced to copper by the reducing agent. The reducing agent may be selected from the group consisting of glyoxylic acid, hydrazine, sodium hypophosphite, and a combination thereof.

In one embodiment, after the chemical plating described above, an electroplating or one or more chemical plating steps may be additionally performed to increase a thickness of a plating layer or form another metal layer on a first chemical plating layer. For example, a nickel layer may be formed on a copper layer to reduce or prevent the copper layer from being oxidized.

In order to make those skilled in the art better understand the present disclosure, examples and comparative examples are illustrated below, in which the adhesive force of the metal layer formed on the substrate is measured using the BYK process disclosed in ISO 2409. Firstly, a 10×10 grid (including 1 mm×1 mm test regions) was formed on a surface of a sample by using a BYK knife and the scraps were cleaned up, in which each cross-cut line reached a bottom of the metal layer. Secondly, an adhesive tape (such as adhesive paper 3M600) was attached to a region to be tested and then was torn off by holding one end of the adhesive tape and quickly moving in a direction perpendicular to the surface of the sample. Such a measurement was carried out twice at a same position, and a level of the adhesive force of the metal layer was thus determined according to following criteria.

ISO level 0: an edge of a cross-cut line is smooth and there is no metal falling off at both edges and intersections of the cross-cut lines.

ISO level 1: there is a small piece of metal falling off at the intersections of the cross-cut lines and an area of the small piece(s) is less than 5% of a total area of the metal layer.

ISO level 2: there are small pieces of metal falling off at both the edges and intersections of the cross-cut lines and an area of the small pieces ranges from 5% to 15% of the total area of the metal layer.

ISO level 3: there are pieces of metal falling off at both the edges and intersections of the cross-cut lines and an area of the pieces ranges from 15% to 35% of the total area of the metal layer.

ISO level 4: there are pieces of metal falling off at both the edges and intersections of the cross-cut lines and an area of the pieces ranges from 35% to 65% of the total area of the metal layer.

ISO level 5: there are pieces of metal falling off at both the edges and intersections of the cross-cut lines and an area of the pieces is greater than 65% of the total area of the metal layer.

In the examples and comparative examples below, a method specified in GB/T 5598-85 was used to measure a thermal conductivity of the circuit board, a method specified in GB/T 5593-1996 was used to measure a withstand voltage of the circuit board, a method specified in GB/T 8014.1-2005 was used to measure the thickness of the alumina layer, and a method specified in GB/T 15717-1995 was used to measure the thickness of the circuit layer. The content of the element(s) in the alumina layer was measured by SEM-EDX, in which, the content of the element(s) was measured as an average of 20 counting points.

In the examples and comparative examples below, unless specified otherwise, the aluminum-based substrate was an aluminum substrate.

EXAMPLE 1

(1) Pretreatment

An aluminum-based substrate was rinsed, then was immersed in a degreasing solution at a temperature ranging from 50° C. to 60° C. for about 10 min, and then was polished by a polishing solution for about 15 min. The degreasing solution comprised: NaOH (10 g/L), $Na_3PO_4$ (30 g/L), $Na_2CO_3$ (15 g/L), and sodium dodecylsulphonate (6 g/L), with water as a solvent. The polishing solution comprised: $H_2SO_4$ (20 wt %), $HNO_3$ (10 wt %), and $H_3PO_4$ (70 wt %), with water as a solvent.

(2) Anodic Oxidation

The aluminum-based substrate was immersed in an electrolyte at 40° C. as an anode, and a stainless steel slice was used as a cathode. At a voltage of 18 V, electrolysis was performed to form an alumina layer with a thickness of 75 µm on the aluminum-based substrate. The electrolyte comprised $H_2SO_4$ (20 wt %) and oxalic acid (2 wt %), with water as a solvent.

(3) Sealing

The aluminum-based substrate was immersed in a nickel fluoride solution at 25° C. for about 18 min, and then was dried. The nickel fluoride solution had a concentration of 1.6 g/L, and a pH ranging from 5.5 to 6, with water as a solvent.

It was measured that a content of the element nickel in the alumina layer was 0.1 wt %.

(4) Activation

A part of the alumina layer was irradiated by a laser to form a circuit pattern. Irradiation was performed using a YAG laser with a wavelength of 1064 nm, a power of 25 W, a frequency of 50 kHz, a scanning speed of 100 mm/s, and a filling pitch of 0.05 mm.

(5) Chemical Plating

The aluminum-based substrate was immersed in a chemical plating solution for chemical plating to form a circuit layer with a thickness of 12 µm on the alumina layer, so as to form a circuit board. The chemical plating solution comprised: $CuSO_4.5H_2O$ (0.12 mol/L), $Na_2EDTA.2H_2O$ (0.14 mol/L), potassium ferrocyanide (10 mg/L), 2,2'-bipyridine (10 mg/L), and glyoxalic acid (HCOCOOH) (0.10 mol/L), with a pH of 12.5-13 adjusted by NaOH and $H_2SO_4$ solutions, and water as a solvent.

It was calculated that a plating rate was about 2.5 µm/h. It was measured that an adhesive force between the circuit layer (i.e., a plating layer) and the alumina layer was ISO level 0, and the circuit board had a thermal conductivity of about 16 W/(m·K) and a breakdown voltage of about 2.2 kV.

COMPARATIVE EXAMPLE 1

This example was performed by using substantially the same process as that described in Example 1 except that step (3) was omitted. As a result, the circuit layer was not formed.

COMPARATIVE EXAMPLE 2

This example was performed by using substantially the same process as that described in Example 1 except that step (3) was performed by immersing the aluminum-based substrate in a boiling water with a pH ranging from 5.5 to 6 for about 20 min. As a result, the circuit layer was not formed.

COMPARATIVE EXAMPLE 3

A silicone layer with a thickness of 75 µm was formed by hot pressing on a surface of an aluminum-based substrate treated as step (1) of Example 1, and then a copper foil (with a thickness of 100 µm) was formed also by hot pressing on the silicone layer to form a laminated plate. Film-applying, developing, exposing, and etching were performed for the laminated plate to form a circuit layer in the laminated plate.

It was measured that an adhesive force between the circuit layer and the aluminum-based substrate was ISO level 0, and the circuit board has a thermal conductivity of about 1.5 W/(m·K) and a breakdown voltage of about 1.6 kV.

COMPARATIVE EXAMPLE 4

An aluminum-based substrate with an alumina layer thereon was formed as steps (1)-(3) of Example 1.

Then, a chemical activating was performed for the aluminum-based substrate, comprising steps of: immersing the aluminum-based substrate in a palladium solution for about 2 min, and then drying the aluminum-based substrate. The palladium solution comprised: $PdCl_2$ (0.3 g/L) and HCl (2 mL/L), with water as a solvent.

Then, a chemical plating was performed for the aluminum-based substrate as step (5) of Example 1, so as to form a plating layer with a thickness of 12 μm.

Then, the aluminum-based substrate was rinsed with deionized water, baked, applied with a film, left standing for 0.5 hour, exposed, developed with a developer (a $Na_2CO_3$ solution (1.0 wt %)), etched with an etchant (a $CuCl_2$ solution), and stripped by a NaOH solution (2.0 wt %) to form a circuit layer, so as to form a circuit board.

It was measured that an adhesive force of the circuit layer was ISO level 2, and the circuit board had a thermal conductivity of about 15 W/(m·K) and a breakdown voltage of about 1.9 kV.

EXAMPLE 2

This example was performed by using substantially the same process as that described in Example 1 except that step (3) was performed by immersing the aluminum-based substrate in a lanthanum chloride aqueous solution at 96° C. for about 30 min. The lanthanum chloride aqueous solution had a concentration of 0.05 mol/L, and a pH ranging from 5 to 5.5, with water as a solvent.

It was measured that a content of the lanthanum element in the alumina layer was 0.11 wt %.

It was calculated that a plating rate was about 2.0 μm/h. It was measured that an adhesive force between the circuit layer (i.e., a plating layer) and the alumina layer was ISO level 0, and the circuit board had a thermal conductivity of about 17 W/(m·K) and a breakdown voltage of about 2.3 kV.

EXAMPLE 3

This example was performed by using substantially the same process as that described in Example 1 except that in step (4) the irradiation was performed using a fiber laser with a wavelength of 1064 nm, a power of 25 W, a frequency of 50 kHz, a scanning speed of 100 mm/s, and a filling pitch of 0.05 mm.

It was calculated that a plating rate is about 2.5 μm/h. It was measured that an adhesive force between the circuit layer (i.e., a plating layer) and the alumina layer was ISO level 0, and the circuit board had a thermal conductivity of about 16 W/(m·K) and a breakdown voltage of about 2.3 kV.

EXAMPLE 4

(1) Pretreatment

An aluminum-based substrate was rinsed, then was immersed in a degreasing solution at a temperature ranging from 50° C. to 60° C. for about 10 min, and then was polished by a polishing solution for about 15 min. The degreasing solution comprised: NaOH (10 g/L), $Na_3PO_4$ (30 g/L), $Na_2CO_3$ (15 g/L), and sodium dodecylsulphonate (6 g/L), with water as a solvent. The polishing solution comprised: $H_2SO_4$ (20 wt %), $HNO_3$ (10 wt %), and $H_3PO_4$ (70 wt %), with water as a solvent.

(2) Anodic Oxidation

The aluminum-based substrate was immersed in an electrolyte at 30° C. as an anode, and a stainless steel slice was used as a cathode. At a voltage of 18 V, electrolysis was performed to form an alumina layer with a thickness of 80 μm on the aluminum-based substrate. The electrolyte comprised $H_2SO_4$ (25 wt %) and oxalic acid (2 wt %), with water as a solvent.

(3) Sealing

The aluminum-based substrate was immersed in a potassium dichromate solution at 90° C. for about 30 min, and then was dried. The potassium dichromate solution had a concentration of 60 g/L, and a pH ranging from 6 to 6.5, with water as a solvent.

It was measured that a content of the element chromium in the alumina layer was 0.2 wt %.

(4) Activation

A part of the alumina layer was irradiated by a laser to form a circuit pattern. The irradiation was performed using a green laser with a wavelength of 532 nm, a power of 20 W, a frequency of 50 kHz, a scanning speed of 100 mm/s, and a filling pitch of 0.05 mm.

(5) Chemical Plating

The aluminum-based substrate was immersed in a chemical plating solution for chemical plating to form a circuit layer with a thickness of 85 μm on the alumina layer, so as to form a circuit board. The chemical plating solution comprised: $CuSO_4 \cdot 5H_2O$ (0.12 mol/L), $Na_2EDTA \cdot 2H_2O$ (0.14 mol/L), potassium ferrocyanide (10 mg/L), 2,2'-bipyridine (10 mg/L), and glyoxalic acid (HCOCOOH) (0.10 mol/L) with a pH of 12.5-13 adjusted by NaOH and $H_2SO_4$ solutions, and water as a solvent.

It was calculated that a plating rate was about 2.8 μm/h. It was measured that an adhesive force between the circuit layer (i.e., a plating layer) and the alumina layer was ISO level 0, and the circuit board had a thermal conductivity of about 17 W/(m·K) and a breakdown voltage of about 2.1 kV.

EXAMPLE 5

(1) Pretreatment

An aluminum-based substrate (i.e., an aluminum alloy substrate) was rinsed, then was immersed in a degreasing solution at a temperature ranging from 50° C. to 60° C. for about 10 min, and then was polished by a polishing solution for about 15 min. The degreasing solution comprised: NaOH (10 g/L), $Na_3PO_4$ (30 g/L), $Na_2CO_3$ (15 g/L), sodium dodecylsulphonate (6 g/L), with water as a solvent. The polishing solution comprised: $H_2SO_4$ (20 wt %), $HNO_3$ (10 wt %), and $H_3PO_4$ (70 wt %), with water as a solvent.

(2) Anodic Oxidation

The aluminum-based substrate was immersed in an electrolyte at 60° C. as an anode, and a stainless steel slice was used as a cathode. At a voltage of 18 V, electrolysis was performed to form an alumina layer with a thickness of 90 μm on the aluminum-based substrate. The electrolyte comprised $H_2SO_4$ (20 wt %) and oxalic acid (3 wt %), with water as a solvent.

(3) Sealing

The aluminum-based substrate was immersed in a nickel acetate solution at 85° C. for about 15 min, and then was dried. The nickel acetate solution had a concentration of 0.5 wt %, and a pH ranging from 5.5 to 6.0, with water as a solvent.

It was measured that a content of the element nickel in the alumina layer was 0.15 wt %.

(4) Activation

A part of the alumina layer was irradiated by a laser to form a circuit pattern. The irradiation was performed using a green laser with a wavelength of 532 nm, a power of 20 W, a frequency of 50 kHz, a scanning speed of 100 mm/s, and a filling pitch of 0.05 mm.

(5) Chemical Plating

The aluminum-based substrate was immersed in a chemical plating solution for chemical plating to form a circuit layer with a thickness of 88 μm on the alumina layer, so as to form a circuit board. The chemical plating solution comprised: $CuSO_4 \cdot 5H_2O$ (0.12 mol/L), $Na_2EDTA \cdot 2H_2O$ (0.14 mol/L), potassium ferrocyanide (10 mg/L), 2,2'-bipyridine (10 mg/L), and glyoxalic acid (HCOCOOH) (0.10 mol/L) with a pH of 12.5-13 adjusted by NaOH and $H_2SO_4$ solutions, and water as a solvent.

It was calculated that a plating rate was about 2.6 pm/h. It was measured that an adhesive force between the circuit layer (i.e., a plating layer) and the alumina layer was ISO level 0, and the circuit board had a thermal conductivity of about 16 W/(m·K) and a breakdown voltage of about 2.2 kV.

EXAMPLE 6

(1) Pretreatment

An aluminum-based substrate was rinsed, then was immersed in a degreasing solution at a temperature ranging from 50° C. to 60° C. for about 10 min, and then was polished by a polishing solution for about 15 min. The degreasing solution comprised: NaOH (10 g/L), $Na_3PO_4$ (30 g/L), $Na_2CO_3$ (15 g/L), and sodium dodecylsulphonate (6 g/L), with water as a solvent. The polishing solution comprised: $H_2SO_4$ (20 wt %), $HNO_3$ (10 wt %), and $H_3PO_4$ (70 wt %), with water as a solvent.

(2) Anodic Oxidation

The aluminum-based substrate was immersed in an electrolyte at 30° C. as an anode, and a stainless steel slice was used as a cathode. At a voltage of 30 V, electrolysis was performed to form an alumina layer with a thickness of 82 μm on the aluminum-based substrate. The electrolyte comprised $H_2SO_4$ (25 wt %) and oxalic acid (2 wt %), with water as a solvent.

(3) Sealing

The aluminum-based substrate was immersed in a nickel sulfate solution at 25° C. for about 15 min, and then was dried. The nickel sulfate solution has a concentration of 1.1 g/L, and a pH ranging from 5.5 to 6.0, with water as a solvent.

It was measured that a content of the element nickel in the alumina layer was 0.1 wt %.

(4) Activation

A part of the alumina layer was irradiated by a laser to form a circuit pattern. The irradiation was performed using a fiber laser with a wavelength of 1064 nm, a power of 25 W, a frequency of 50 kHz, a scanning speed of 100 mm/s, and a filling pitch of 0.05 mm.

(5) Chemical Plating

The aluminum-based substrate was immersed in a chemical plating solution for chemical plating to form a circuit layer with a thickness of 78 μm on the alumina layer, so as to form a circuit board. The chemical plating solution comprised: $CuSO_4 \cdot 5H_2O$ (0.12 mol/L), $Na_2EDTA \cdot 2H_2O$ (0.14 mol/L), potassium ferrocyanide (10 mg/L), 2,2'-bipyridine (10 mg/L), and glyoxalic acid (HCOCOOH) (0.10 mol/L) with a pH of 12.5-13 adjusted by NaOH and $H_2SO_4$ solutions, with water as a solvent.

It was calculated that a plating rate was about 2.4 μm/h. It was measured that an adhesive force between the circuit layer (i.e., a plating layer) and the alumina layer was ISO level 0, and the circuit board had a thermal conductivity of about 16 W/(m·K) and a breakdown voltage of about 2.3 kV.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles, and scope of the present disclosure.

What is claimed is:

1. A circuit board, comprising:
an aluminum-based substrate;
an alumina layer formed on at least one surface of the aluminum-based substrate, wherein the alumina layer includes a circuit pattern formed by irradiation of an energy beam; and
a circuit layer formed on the circuit pattern of the alumina, wherein the alumina layer comprises alumina and at least one element selected from chromium, lanthanum, cerium, praseodymium, neodymium, promethium, samarium, europium, gadolinium, terbium, dysprosium, holmium, thulium, ytterbium, lutetium, scandium, or a combination thereof.

2. The circuit board according to claim 1, wherein a content of the element in the alumina layer ranges from 0.001 wt % to 20 wt %.

3. The circuit board according to claim 1, wherein the content of the element in the alumina layer ranges from 0.01 wt % to 1 wt %.

4. The circuit board according to claim 1, wherein a thickness of the alumina layer ranges from 10 μm to 300 μm.

5. The circuit board according to claim 1, wherein the thickness of the alumina layer ranges from 50 μm to 100 μm.

6. The circuit board according to claim 1, wherein the alumina layer is sealed with a sealing agent.

7. The circuit board according to claim 6, wherein the sealing agent is selected from one or more dichromate, one or more nickel salt, one or more rare earth metal salt, or a combination thereof.

8. The circuit board according to claim 6, wherein the sealing agent is selected from potassium dichromate, sodium dichromate, nickel fluoride, nickel acetate, nickel sulfate, or a combination thereof.

* * * * *